United States Patent
Chen et al.

(10) Patent No.: US 12,087,222 B2
(45) Date of Patent: Sep. 10, 2024

(54) SUBPIXELS WITH REDUCED DIMENSIONS BY USING SHARED SWITCHING TRANSISTORS

(71) Applicant: META PLATFORMS TECHNOLOGIES, LLC, Menlo Park, CA (US)

(72) Inventors: Gang Chen, San Jose, CA (US); Qianqian Wang, Santa Clara, CA (US); Min Hyuk Choi, San Jose, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 17/709,978

(22) Filed: Mar. 31, 2022

(65) Prior Publication Data
US 2023/0317000 A1    Oct. 5, 2023

(51) Int. Cl.
*G09G 3/3233* (2016.01)
*G09G 3/00* (2006.01)
*H10K 59/121* (2023.01)

(52) U.S. Cl.
CPC ......... *G09G 3/3233* (2013.01); *H10K 59/121* (2023.02); *G09G 3/002* (2013.01); *G09G 2300/0426* (2013.01); *G09G 2300/0443* (2013.01); *G09G 2300/0452* (2013.01); *G09G 2300/0819* (2013.01); *G09G 2300/0852* (2013.01)

(58) Field of Classification Search
None
See application file for complete search history.

(56) References Cited

U.S. PATENT DOCUMENTS

| | | | |
|---|---|---|---|
| 8,405,692 B2 * | 3/2013 | Brown Elliott | G02F 1/133514 345/694 |
| 9,741,755 B2 * | 8/2017 | Wan | H01L 27/14641 |
| 10,062,311 B2 * | 8/2018 | Hsin | H01L 27/3262 |
| 2001/0038098 A1 * | 11/2001 | Yamazaki | H01L 29/42384 257/72 |

(Continued)

OTHER PUBLICATIONS

International Search Report and Written Opinion for International Application No. PCT/US2023/016590, mailed Jul. 4, 2023, 10 pages.

(Continued)

*Primary Examiner* — Dorothy Harris
(74) *Attorney, Agent, or Firm* — Weaver Austin Villeneuve & Sampson LLP

(57) ABSTRACT

Embodiments relate to a display device with subpixels that share switch transistors that selectively connect sources of driving transistors to a high voltage source. Further, part of reset transistors or part of a select transistor may be shared across multiple subpixels. The reset transistor selectively connects an anode of an organic light emitting diode (OLED) to a low voltage source. The select transistor selectively passes through pixel data from a data line when a gate signal is received via a gate line. Driver transistors and capacitors of the subpixels are independent and not shared. In this way, the dimensions of the subpixels may be reduced and enable increase in the density of the pixels.

18 Claims, 9 Drawing Sheets

(56) References Cited

U.S. PATENT DOCUMENTS

| | | | |
|---|---|---|---|
| 2002/0070909 A1* | 6/2002 | Asano | H01L 27/3211 345/76 |
| 2003/0230763 A1* | 12/2003 | Kimura | H01L 27/12 257/E27.111 |
| 2007/0075955 A1* | 4/2007 | Jung | G09G 3/2074 345/92 |
| 2007/0128583 A1* | 6/2007 | Miyazawa | G09G 3/3266 434/433 |
| 2007/0194213 A1 | 8/2007 | Augusto | |
| 2009/0242741 A1* | 10/2009 | Konishi | H01L 27/1463 438/73 |
| 2012/0280962 A1* | 11/2012 | Kawabe | G09G 3/3648 345/211 |
| 2013/0214276 A1 | 8/2013 | Kubota et al. | |
| 2014/0111404 A1* | 4/2014 | Omata | H05B 45/60 345/76 |
| 2014/0111557 A1* | 4/2014 | Omata | G09G 3/3233 345/76 |
| 2015/0077412 A1* | 3/2015 | Nakamura | G09G 3/2007 345/212 |
| 2015/0187272 A1* | 7/2015 | Kimura | G09G 3/3233 345/694 |
| 2015/0228223 A1* | 8/2015 | Park | G09G 3/3208 345/77 |
| 2015/0235599 A1* | 8/2015 | Cho | H01L 27/1222 345/206 |
| 2015/0316824 A1* | 11/2015 | Ohishi | H01L 27/1244 438/599 |
| 2016/0064411 A1* | 3/2016 | Park | G09G 3/3233 257/89 |
| 2016/0293103 A1* | 10/2016 | Kimura | G09G 3/3233 |
| 2017/0186782 A1* | 6/2017 | Lee | H01L 27/1225 |
| 2017/0249901 A1* | 8/2017 | Nakamura | G09G 3/3266 |
| 2017/0358262 A1* | 12/2017 | Moon | H01L 27/00 |
| 2018/0350846 A1* | 12/2018 | Kasahara | G09G 3/30 |
| 2019/0007633 A1* | 1/2019 | Kwag | H01L 27/14612 |
| 2019/0341431 A1* | 11/2019 | Lee | G09G 3/3258 |
| 2021/0111227 A1* | 4/2021 | Tsuboi | H01L 27/3262 |
| 2021/0241684 A1* | 8/2021 | Ogawa | G09F 9/30 |
| 2022/0232180 A1* | 7/2022 | Mun | H04N 25/771 |

OTHER PUBLICATIONS

Kimura K., et al., "New Pixel Driving Circuit using Self-Discharging Compensation Method for High-Resolution OLED Micro Displays on a Silicon Backplane," Journal of the Society for Information Display—SID, vol. 25, No. 3, Mar. 1, 2017, pp. 167-176.

* cited by examiner

SUBPIXELS WITH REDUCED DIMENSIONS BY USING SHARED SWITCHING TRANSISTORS

BACKGROUND

This disclosure relates to a display device, and specifically to reducing the dimensions of subpixels in the display device.

A display device is often used in a virtual reality (VR) or augmented-reality (AR) system as a head-mounted display (HMD) or a near-eye display (NED). To display high resolution images, it is beneficial to increase the number of pixels or subpixels in the display device and operate the display device with a higher frame rate. However, increasing the density of pixels results in a lower yield of the display devices due to smaller feature sizes of components in the display devices. That is, the increase in the density of pixels or subpixels accompany reduced size of transistors and other circuit components. Hence, the size of these circuit components may inhibit further miniaturization of the display device.

SUMMARY

Embodiments relate to a display device including a plurality of subpixels that share a switch transistor. The subpixels may include a first subpixel and a second subpixel. The first subpixel includes a first organic light emitting diode (OLED), a reset transistor, a select transistor, a switch transistor and a driving transistor. The reset transistor resets the subpixel for a next cycle of operation. The select transistor selectively passes through a pixel data from a data line responsive to receiving a gate signal from a gate line. The switch transistor selectively connects a source of the driving transistor to a high voltage source. The driving transistor has a drain coupled to the first OLED and a gate coupled to the first switch. The second subpixel is adjacent to the first subpixel and shares the switch transistor with the first subpixel.

BRIEF DESCRIPTION OF DRAWINGS

Figures (FIGS. 1A and 1B are diagrams of head-mounted displays (HMDs) that include near-eye displays (NED), according to some embodiments.

The figures depict embodiments of the present disclosure for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 1A:
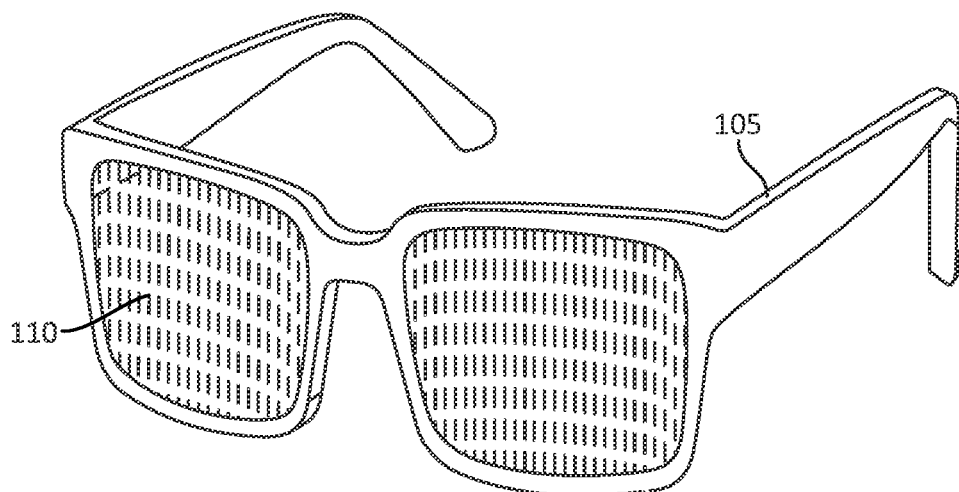
Figure 1B:
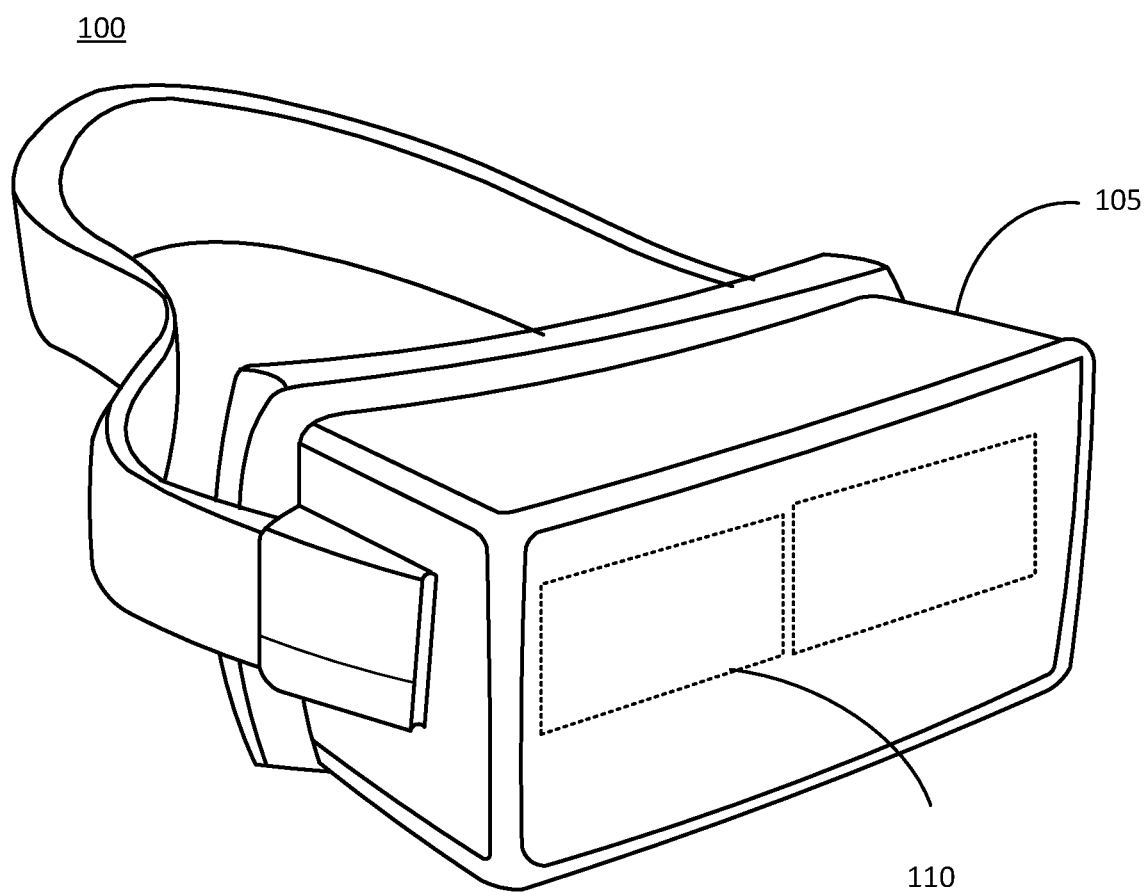

Figures (FIGS. 1A and 1B are diagrams of head-mounted displays (HMDs) 100 that include near-eye displays (NED) 110, according to some embodiments. The 110 may present media to a user. Examples of media that may be presented by the NED 110 include one or more images, video, audio, or some combination thereof. In some embodiments, audio may be presented via an external device (e.g., speakers and/or headphones) that receives audio information from the HMD 100, a console (not shown), or both, and presents audio data to the user based on the audio information. The HMD 100 is generally configured to operate as a virtual reality (VR) HMD. However, in some embodiments, the HMD 100 may be modified to also operate as an augmented reality (AR) HMD, a mixed reality (MR) HMD, or some combination thereof. For example, in some embodiments, the HMD 100 may augment views of a physical, real-world environment with computer-generated elements (e.g., still images, video, sound, etc.).

The HMD 100 shown in FIG. 1A or 1B may include a frame 105 and a display 110. The frame 105 may include one or more optical elements that together display media to a user. That is, the display 110 may be configured for a user to view the content presented by HMD 100. As discussed below in conjunction with FIG. 2, the display 110 may include at least one source assembly to generate image light to present optical media to an eye of the user. The source assembly may include, e.g., a source, an optics system, or some combination thereof.

FIGS. 1A and 1B are merely examples of a virtual reality system, and the display systems described herein may be incorporated into further such systems.

Figure 2:
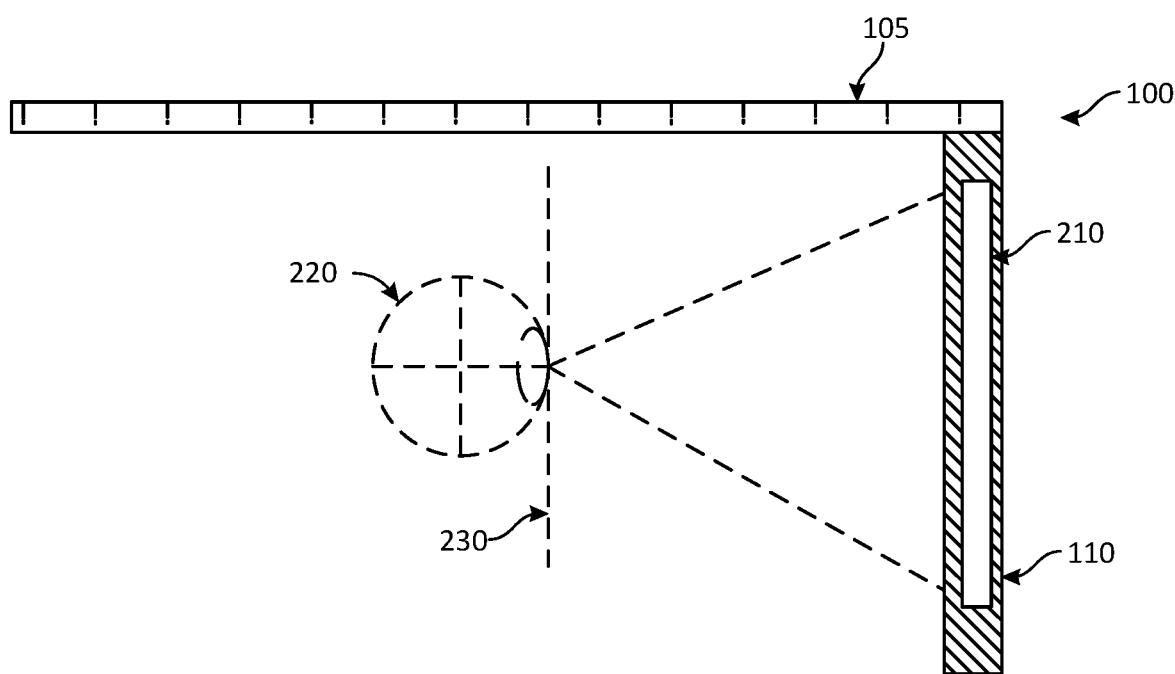
FIG. 2 is a cross-sectional view of the HMD illustrated in FIG. 1, according to some embodiments.

FIG. 2 is a cross section 200 of the HMD 100 illustrated in FIG. 1A or 1B, in accordance with some embodiments of the present disclosure. The cross section 200 may include at least one display assembly 210, and an exit pupil 230. The exit pupil 230 is a location where the eye 220 may be positioned when the user wears the HMD 100. In some embodiments, the frame 105 may represent a frame of eye-wear glasses. For purposes of illustration, FIG. 2 shows the cross section 200 associated with a single eye 220 and a single display assembly 210, but in alternative embodiments not shown, another display assembly that is separate from or integrated with the display assembly 210 shown in FIG. 2, may provide image light to another eye of the user.

The display assembly 210 may direct the image light to the eye 220 through the exit pupil 230. The display assembly 210 may be composed of one or more materials (e.g., plastic, glass, etc.) with one or more refractive indices that effectively decrease the weight and widen a field of view of the HMD 100.

In alternate configurations, the HMD 100 may include one or more optical elements (not shown) between the display assembly 210 and the eye 220. The optical elements may act to, by way of various examples, correct aberrations in image light emitted from the display assembly 210, magnify image light emitted from the display assembly 210, perform some other optical adjustment of image light emitted from the display assembly 210, or combinations thereof. Example optical elements may include an aperture, a Fresnel lens, a convex lens, a concave lens, a filter, or any other suitable optical element that may affect image light.

In some embodiments, the display assembly 210 may include a source assembly to generate image light to present media to a user's eyes. The source assembly may include, e.g., a light source, an optics system, or some combination thereof. In accordance with various embodiments, a source assembly may include a light-emitting diode (LED) such as an organic light-emitting diode (OLED).

Figure 3:
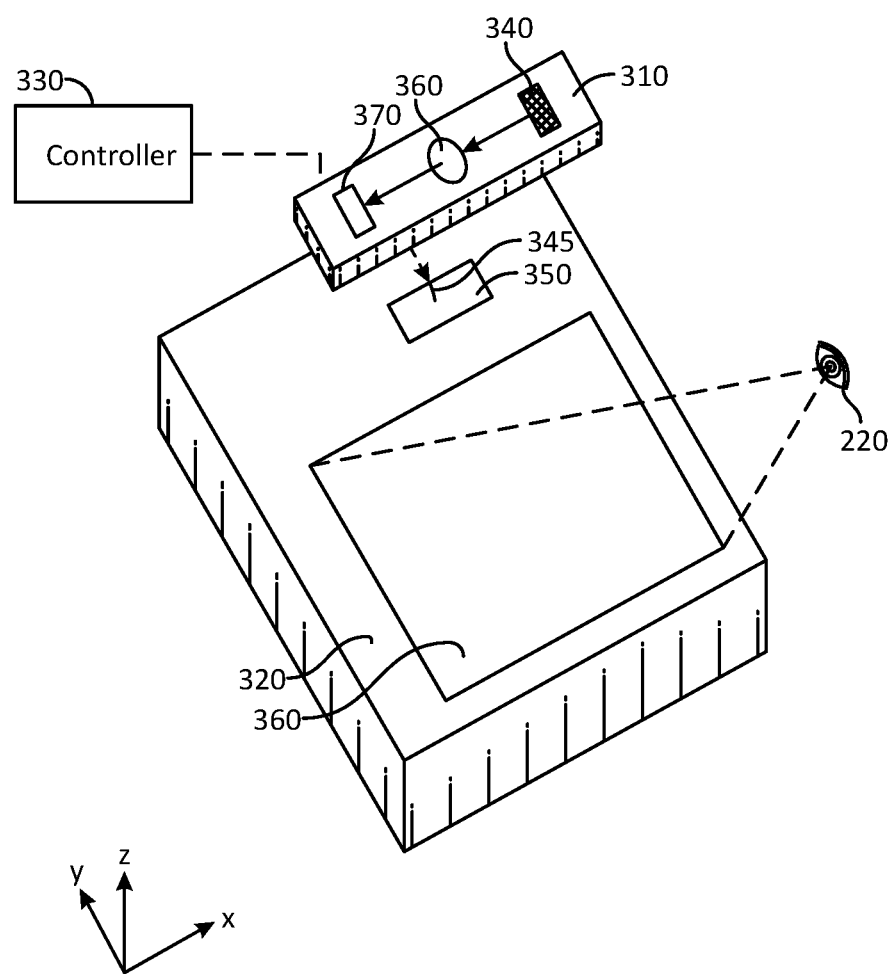
FIG. 3 illustrates a perspective view of a waveguide display, according to some embodiments.

FIG. 3 illustrates a perspective view of a waveguide display 300 in accordance with some embodiments. The waveguide display 300 may be a component (e.g., display assembly 210) of HMD 100. In alternate embodiments, the waveguide display 300 may constitute a part of some other HMD, or other system that directs display image light to a particular location.

The waveguide display 300 may include, among other components, a source assembly 310, an output waveguide 320, and a controller 330. For purposes of illustration, FIG. 3 shows the waveguide display 300 associated with a single eye 220, but in some embodiments, another waveguide display separate (or partially separate) from the waveguide display 300 may provide image light to another eye of the user. In a partially separate system, for instance, one or more components may be shared between waveguide displays for each eye.

The source assembly 310 generates image light. The source assembly 310 may include a source 340, a light conditioning assembly 360, and a scanning mirror assembly 370. The source assembly 310 may generate and output image light 345 to a coupling element 350 of the output waveguide 320.

The source 340 may include a source of light that generates at least a coherent or partially coherent image light 345. The source 340 may emit light in accordance with one or more illumination parameters received from the controller 330. The source 340 may include one or more source elements, including, but not restricted to light emitting diodes, such as micro-OLEDs, as described in detail below with reference to FIGS. 4-10.

The output waveguide 320 may be configured as an optical waveguide that outputs image light to an eye 220 of a user. The output waveguide 320 receives the image light 345 through one or more coupling elements 350 and guides the received input image light 345 to one or more decoupling elements 360. In some embodiments, the coupling element 350 couples the image light 345 from the source assembly 310 into the output waveguide 320. The coupling element 350 may be or include a diffraction grating, a holographic grating, some other element that couples the image light 345 into the output waveguide 320, or some combination thereof. For example, in embodiments where the coupling element 350 is a diffraction grating, the pitch of the diffraction grating may be chosen such that total internal reflection occurs, and the image light 345 propagates internally toward the decoupling element 360. For example, the pitch of the diffraction grating may be in the range of approximately 300 nm to approximately 600 nm.

The decoupling element 360 decouples the total internally reflected image light from the output waveguide 320. The decoupling element 360 may be or include a diffraction grating, a holographic grating, some other element that decouples image light out of the output waveguide 320, or some combination thereof. For example, in embodiments where the decoupling element 360 is a diffraction grating, the pitch of the diffraction grating may be chosen to cause incident image light to exit the output waveguide 320. An orientation and position of the image light exiting from the output waveguide 320 may be controlled by changing an orientation and position of the image light 345 entering the coupling element 350.

The output waveguide 320 may be composed of one or more materials that facilitate total internal reflection of the image light 345. The output waveguide 320 may be composed of, for example, silicon, glass, or a polymer, or some combination thereof. The output waveguide 320 may have a relatively small form factor such as for use in a head-mounted display. For example, the output waveguide 320 may be approximately 30 mm wide along an x-dimension, 50 mm long along a y-dimension, and 0.5-1 mm thick along a z-dimension. In some embodiments, the output waveguide 320 may be a planar (2D) optical waveguide.

The controller 330 may be used to control the scanning operations of the source assembly 310. In certain embodiments, the controller 330 may determine scanning instructions for the source assembly 310 based at least on one or more display instructions. Display instructions may include instructions to render one or more images. In some embodiments, display instructions may include an image file (e.g., bitmap). The display instructions may be received from, e.g., a console of a virtual reality system (not shown). Scanning instructions may include instructions used by the source assembly 310 to generate image light 345. The scanning instructions may include, e.g., a type of a source of image light (e.g. monochromatic, polychromatic), a scanning rate, an orientation of scanning mirror assembly 370, and/or one or more illumination parameters, etc. The controller 330 may include a combination of hardware, software, and/or firmware not shown here so as not to obscure other aspects of the disclosure.

According to some embodiments, source 340 may include a light emitting diode (LED), such as an organic light emitting diode (OLED). An organic light-emitting diode (OLED) is a light-emitting diode (LED) having an emissive electroluminescent layer that may include a thin film of an organic compound that emits light in response to an electric current. The organic layer is typically situated between a pair of conductive electrodes. One or both of the electrodes may be transparent.

As will be appreciated, an OLED display can be driven with a passive-matrix (PMOLED) or active-matrix (AMOLED) control scheme. In a PMOLED scheme, each row (and line) in the display may be controlled sequentially, whereas AMOLED control typically uses a thin-film transistor backplane to directly access and switch each individual pixel on or off, which allows for higher resolution and larger display areas.

In other embodiments, the OLED display is embodied as part of a display panel that does not include any waveguide. The OLED display may be a screen that is viewable directly by to the user's eye instead of passing light through a waveguide.

Figure 4:
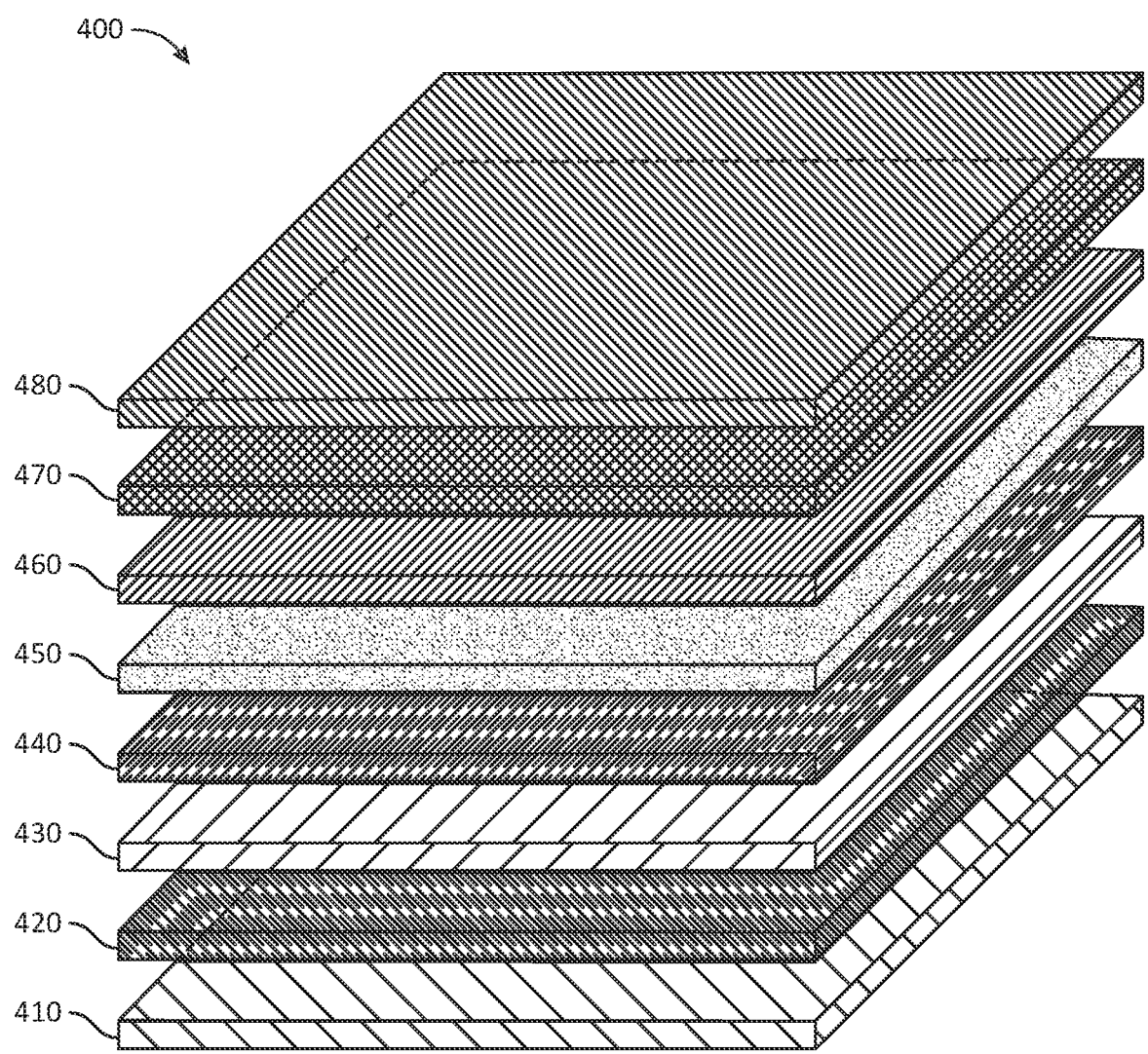
FIG. 4 depicts a simplified OLED structure, according to some embodiments.

FIG. 4 depicts a simplified OLED structure according to some embodiments. As shown in an exploded view, OLED 400 may include, from bottom to top, a substrate 410, anode 420, hole injection layer 430, hole transport layer 440, emissive layer 450, blocking layer 460, electron transport layer 470, and cathode 480. In some embodiments, substrate (or backplane) 410 may include single crystal or polycrystalline silicon or other suitable semiconductor (e.g., germanium).

Anode 420 and cathode 480 may include any suitable conductive material(s), such as transparent conductive oxides (TCOs, e.g., indium tin oxide (ITO), zinc oxide (ZnO), and the like). The anode 420 and cathode 480 are configured to inject holes and electrons, respectively, into one or more organic layer(s) within emissive layer 450 during operation of the device.

The hole injection layer 430, which is disposed over the anode 420, receives holes from the anode 420 and is configured to inject the holes deeper into the device, while the adjacent hole transport layer 440 may support the transport of holes to the emissive layer 450. The emissive layer 450 converts electrical energy to light. Emissive layer 450 may include one or more organic molecules, or light-emitting fluorescent dyes or dopants, which may be dispersed in a suitable matrix as known to those skilled in the art.

Blocking layer 460 may improve device function by confining electrons (charge carriers) to the emissive layer 450. Electron transport layer 470 may support the transport of electrons from the cathode 480 to the emissive layer 450.

In some embodiments, the generation of red, green, and blue light (to render full-color images) may include the formation of red, green, and blue OLED sub-pixels in each pixel of the display. Alternatively, the OLED 400 may be adapted to produce white light in each pixel. The white light may be passed through a color filter to produce red, green, and blue sub-pixels.

Any suitable deposition process(es) may be used to form OLED 400. For example, one or more of the layers constituting the OLED may be fabricated using physical vapor deposition (PVD), chemical vapor deposition (CVD), evaporation, spray-coating, spin-coating, atomic layer deposition (ALD), and the like. In further aspects, OLED 400 may be manufactured using a thermal evaporator, a sputtering system, printing, stamping, etc.

According to some embodiments, OLED 400 may be a micro-OLED. A "micro-OLED," in accordance with various examples, may refer to a particular type of OLED having a small active light emitting area (e.g., less than 2,000 µm2 in some embodiments, less than 20 µm2 or less than 10 µm2 in other embodiments). In some embodiments, the emissive surface of the micro-OLED may have a diameter of less than approximately 2 µm. Such a micro-OLED may also have collimated light output, which may increase the brightness level of light emitted from the small active light emitting area.

Figure 5:
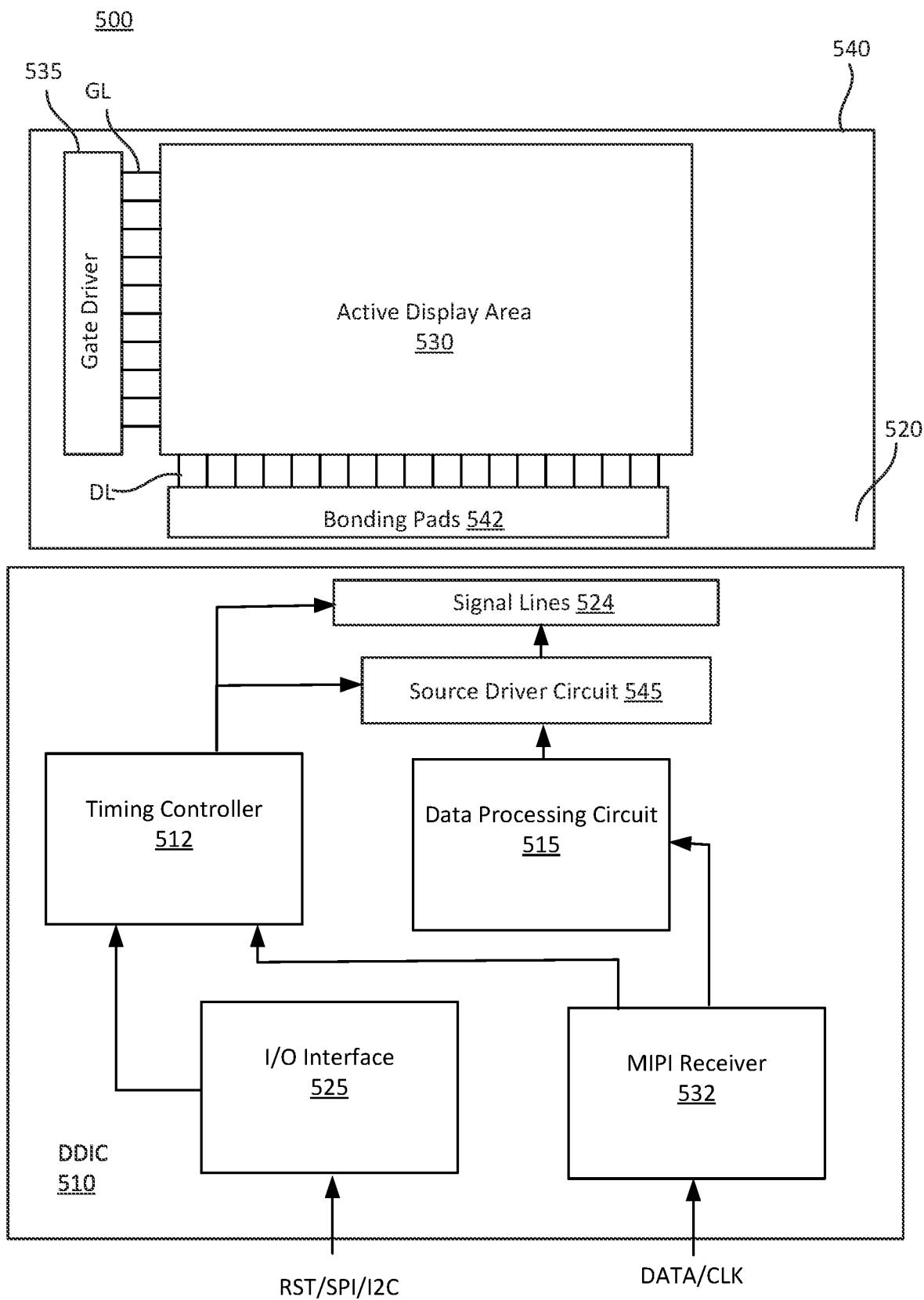
FIG. 5 is a schematic view of an OLED display device architecture including a display driver integrated circuit (DDIC), according to some embodiments.

FIG. 5 is a schematic view of an OLED display device architecture including a display driver integrated circuit (DDIC) 510 according to some embodiments. According to some embodiments, OLED display device 500 (e.g., micro-OLED chip) may include an active display area 530 over a single crystal (e.g., silicon) backplane 520. The combined display/backplane architecture, i.e., display element 540 may be bonded (e.g., at or about interface A) directly or indirectly to the DDIC 510. As illustrated in FIG. 7, DDIC 510 may include an array of driving transistors 712, which may be formed using conventional CMOS processing. One or more display driver integrated circuits may be formed over a single crystal (e.g., silicon) substrate.

In some embodiments, the active display area 530 may have at least one areal dimension (i.e., length or width) greater than approximately 1.3 inches, e.g., approximately 1.4, 1.5, 1.6, 1.7, 1.8, 1.9, 2.0, 2.25, 2.5, 2.75, or 3 inches, including ranges between any of the foregoing values, although larger area displays are contemplated.

The DDIC 510 may be directly bonded to a back face of the backplane opposite to active matrix 832 (see FIGS. 8A through 8D). In further embodiments, a chip-on-flex (COF) packaging technology may be used to integrate display element 540 with DDIC 510. As used herein, the terms "multiplexer" or "data selector" may, in some examples, refer to a device adapted to combine or select from among plural analog or digital input signals, which are transmitted to a single output. Multiplexers may be used to increase the amount of data that can be communicated within a certain amount of space, time, and bandwidth.

As used herein, "chip-on-flex" (COF) may, in some examples, refer to an assembly technology where a microchip or die, such as an OLED chip, is directly mounted on and electrically connected to a flexible circuit, such as a direct driver circuit. In a COF assembly, the microchip may avoid some of the traditional assembly steps used for individual IC packaging. This may simplify the overall processes of design and manufacture while improving performance and yield.

In accordance with certain embodiments, assembly of the COF may include attaching a die to a flexible substrate, electrically connecting the chip to the flex circuit, and encapsulating the chip and wires, e.g., using an epoxy resin to provide environmental protection. In some embodiments, the adhesive (not shown) used to bond the chip to the flex substrate may be thermally conductive or thermally insulating. In some embodiments, ultrasonic or thermosonic wire bonding techniques may be used to electrically connect the chip to the flex substrate.

The OLED display device 500 may include, among other components, the DDIC 510 and the display element 540. The display element 540 may be an integrated circuit including the backplane 520, the active display area 530, bonding pads 542, and a control circuit for controlling the active display area 530. The control circuit may include a gate driver 535. The DDIC 510 may include a timing controller 512, a data processing circuit 515, an input/output (I/O) interface 525, a mobile industry processor interface (MIPI) receiver 532, a source driver circuit 545 and signal lines 524. In other embodiments, one or more components of the DDIC 510 may be disposed in the display element 540.

The timing controller 610 may be configured to generate timing control signals for the gate driver 535, the source driver circuit 545, and other components in the display element 540. The timing control signals may include one or more clock signals, a vertical synchronization signal, a horizontal synchronization signal, and a start pulse. However, timing control signals provided from the timing controller 512 according to embodiments of the present disclosure are not limited thereto.

The data processing circuit 515 may be configured to receive image data DATA from the MIPI receiver 532 and convert the data format of the image data DATA to generate data signals input to the source driver circuit 645 for displaying images in the active display area 530.

The I/O interface 525 is a circuit that receives control signals from other sources and sends operation signals to the timing controller 610. The control signals may include a reset signal RST to reset the display element 540 for a next cycle, and signals according to serial peripheral interface (SPI) or inter-integrated circuit (I2C) protocols for digital data transfer. Based on the received control signals, the I/O interface 625 may process commands from a system on a chip (SoC), a central processing unit (CPU), or other system control chip.

The MIPI receiver 532 may be a MIPI display serial interface (DSI), which may include a high-speed packet-based interface for delivering video data to the pixels in the active display area 530. The MIPI receiver 630 may receive image data DATA and clock signals CLK and provide timing control signals to the timing controller 512 and image data DATA to the data processing circuit 515.

The active display area 530 may include a plurality of pixels arranged into rows and columns with each pixel including a plurality of subpixels (e.g., a red subpixel, a green subpixel, a blue subpixel). Each subpixel may be connected to a gate line GL and a data line DL and driven to emit light according to a data signal received through the connected data line DL when the connected gate line GL provides a gate-on signal to the subpixel.

The backplane 520 may include conductive traces for electrically connecting the pixels in the active display area 530, the gate driver 535, the source driver circuit 545, and the bonding pads 542. The bonding pads 542 are conductive regions on the backplane 520 that are electrically coupled to the signal lines 524 of the DDIC 510 to receive timing control signals from the timing controller 512, and data signals from the source driver circuit 545. The bonding pads 542 are connected to the gate driver 535 and other circuit elements in the backplane 520. In the embodiment illustrated in FIG. 5, the DDIC 510 generates data signals and timing control signals and transmits the signals to the bonding pads 542 of the display element 540. However, in other embodiments, the timing controller 512, the source driver circuit 545 and/or the data processing circuit 515 may be in the display element 540 instead of the DDIC 510. When the timing controller 512 and/or the data processing circuit 515 are on the display element 540, there may be fewer bonding pads 542 since the data signals and timing control signals may be directly transmitted to the corresponding component without a bonding pad 542.

The gate driver 535 may be connected to a plurality of gate lines GL and provide gate-on signals to the plurality of gate lines GL at appropriate times. The gate driver 535 includes a plurality of stages, where each stage is connected to a gate line GL that outputs gate-on signals to a row of pixels.

The source driver circuit 545 may receive data signals from the data processing circuit 515 and provide the data signals to the active display area 530 via data lines DL. The source driver circuit 645 may include a plurality of source drivers, each source driver connected to a column of pixels via a data line DL.

Figure 6:
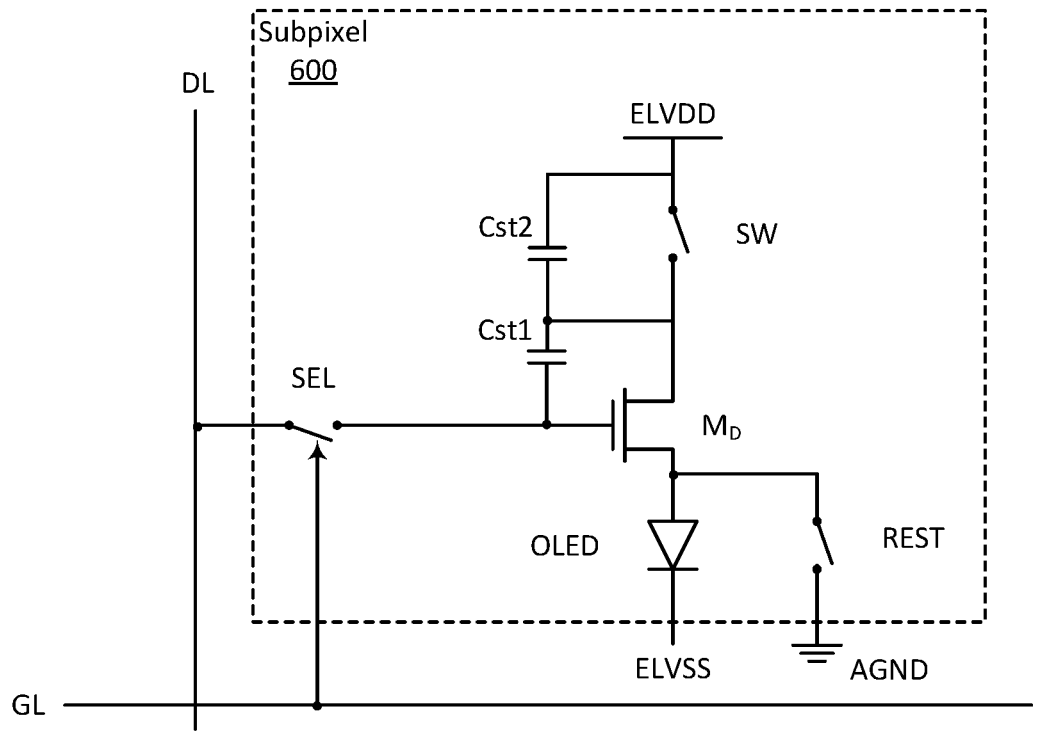
FIG. 6 is a circuit diagram of a subpixel with four transistors and two capacitors, according to some embodiments.

FIG. 6 is a circuit diagram illustrating a subpixel 600, according to some embodiments. The subpixel 600 may be included in any of the pixels in the display element 540. The subpixel 600 may include, among other components, a select transistor SEL, a driving transistor MD, an OLED, a reset transistor REST, a switch transistor SW, capacitor Cst1 and capacitor Cst2. The OLED is connected between a low voltage source ELVSS and a drain of the driving transistor MD. When the switch transistor SW is turned on and the reset transistor REST is turned off, the driving transistor MD generates current in its drain that increases as a voltage stored by the storage capacitor Cst1 increases. The current is then provided to the OLED to drive the OLED. The OLED then generates light of intensity that corresponds to the amount of current provided by the driving transistor MD.

The select transistor SEL controls a connection between the gate terminal of the driving transistor MD and the data line DL. When the gate line GL provides a gate-on signal (e.g., turns low), the select transistor SEL turns on, connecting the gate of the driving transistor MD to the data line DL and charging the storage capacitor Cst1 based on a voltage difference between the voltage of the pixel data at the data line DL and the high voltage level (ELVDD). When the gate-on signal is turned off in gate line GL, the select transistor SEL is turned off, disconnecting the gate of the driving transistor MD from the data line DL.

The reset transistor REST enables or disables the current from the driving transistor MD to flow in the OLED. When the reset transistor REST is turned on, current from the driving transistor MD flows through the reset transistor REST to ground or a lower voltage source (AGND) that has a lower potential. Conversely, when the reset transistor REST is turned off, the current from the driving transistor MD flows in the OLED.

The switch transistor SW is turned on or off to couple a high voltage source ELVDD to a source of the driving transistor MD. Capacitor Cst2 stores a voltage difference between the high voltage source ELVDD and the source of the driving transistor MD when the switch transistor SW is turned off.

In one or more embodiments, the transistors SEL, REST, SW and driving transistor MD are embodied as P-channel metal-oxide-semiconductor (PMOS) transistors. Further, these components are fabricated on a silicon substrate.

The subpixel 600 illustrated in FIG. 6 is merely an example, and subpixels with different architecture may be used in other embodiments. For example, a subpixel with only one capacitor (e.g., Cst1) may be used.

Figure 7B:
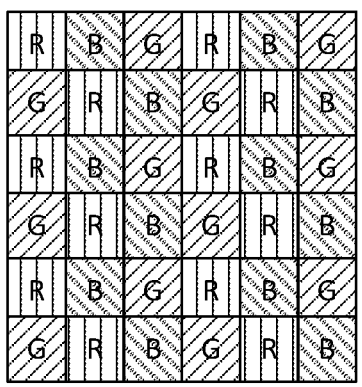
FIG. 7B is a diagram illustrating a color arrangement for the array of subpixels in FIG. 7A, according to some embodiments.
Figure 7C:
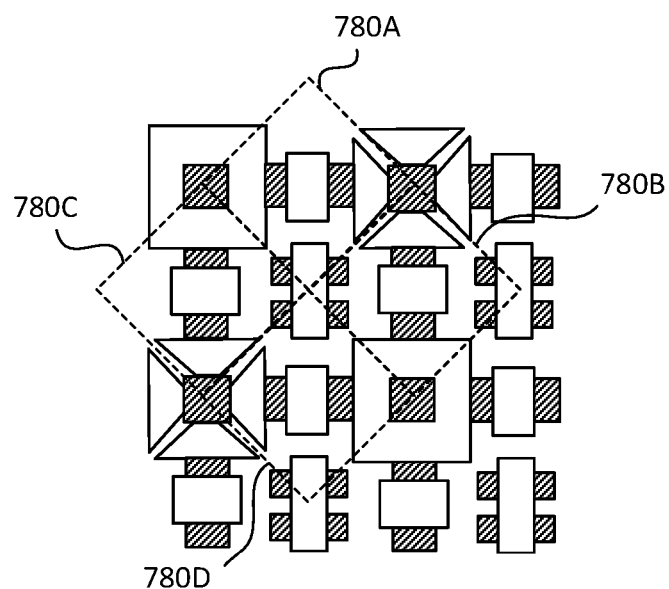
FIG. 7C is a diagram illustrating arrangement of subpixels, according to one embodiment.
Figure 7A:
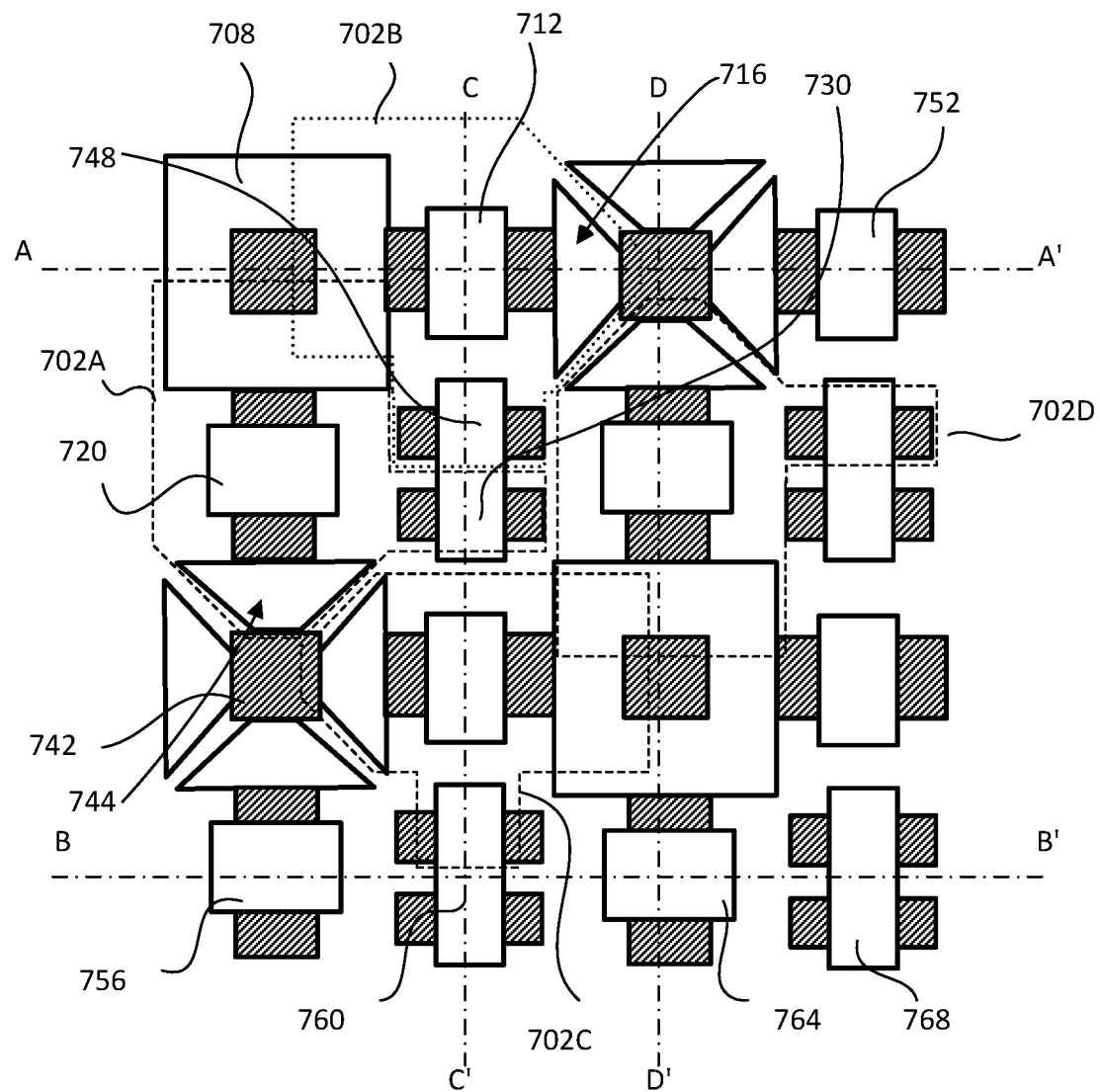
FIG. 7A is a plan view of an array of subpixels, according to one embodiment.

FIG. 7A is a plan view of a portion of an array of subpixels including, among others, subpixel 702A through 702D, according to one embodiment. The hatch patterned shapes represent active areas of transistors while empty shapes represent gate electrodes of the transistors. Each of the subpixels may include a switch transistor, a driving transistor, an OLED, a select transistor, a reset transistor and one or more capacitors, as shown in FIG. 6. For example, the first subpixel 702A may include a part of switch transistor 708, driving transistor 720 (extending vertically in FIG. 7A), select transistor 730 and one of reset transistors 744. The second subpixel 702B may include another part of the switch transistor 708, driving transistor 712 (extending horizontally in FIG. 7A), select transistor 748 and one of reset transistors 716. The capacitors are placed in one or more of metal layers M1 through M3 (shown in FIGS. 8A through 8D) and are not shown in FIG. 7A.

Another subpixel (part of which is shown in FIG. 7B) to the right of subpixel 702B has a shape that is a mirrored version of the shape of the subpixel 702B. A subpixel above the subpixel 702A (part of which is shown in FIG. 7B) also has a shape that is a mirrored version of the shape of the subpixel 702A. The subpixel 702C has a shape that is a mirrored version of the shape of the subpixel 702B. FIG. 7A illustrates only a subset of subpixels in the display area 530, and many more subpixels are included in the display area 530.

One or more components or circuit elements are shared across multiple subpixels. The first and second subpixels 702A, 702B share the same switch transistor 708 along with two other subpixels (one extending vertically upward and another extending left from the switch transistor 708). That is, four subpixels share the same switch transistor 708. Further, the select transistors 730, 748 share a common gate electrode but have distinct active areas that are separated by shallow trench isolation (STI). The select transistors 730, 748 are placed in the middle between four driving transistors, two switch transistors and two reset transistor. In one or more embodiments, an active area 742 of the four reset transistors 744 are also shared but each of the reset transistors 744 has a separate gate electrode because each gate electrode is operated at different times. In other embodiments where global lighting is performed, the gate electrodes of multiple reset transistors are shared to simplify the layout of contacts and conductive lines. In contrast, each subpixel has its separate driving transistor, one or more capacitors, and an OLED.

By sharing switch transistors, the gate electrodes of the select transistors, and/or at least part of the reset transistors across multiple subpixels, the pixel size can be reduced and the pixel density can be increased. In some embodiments, the layout of through contacts and vias and conductive lines connecting the transistor may also be simplified, resulting in better yield and lower cost of the display device.

The driving transistors of subpixels extend horizontally or vertically. Subpixels that extend horizontally have their driving transistors extend horizontally while subpixels that extend vertically have their driving transistors extend vertically. For example, the subpixel 702A has a driving transistor 720 extending vertically while the subpixel 702B extending horizontally has a driving transistor 712 that extends horizontally.

The layout of the transistors in FIG. 7A is merely illustrative. The transistors of the subpixels may be of different shapes and their layout patterns may be different than those of FIG. 7A. Further, the layout may include additional transistors or additional conductive lines.

FIG. 7B is a diagram illustrating color arrangement for the array of subpixels in FIG. 7A, according to some embodiments. As the components of the subpixels are of generally a square or a diamond shape instead of being an elongated rectangle shape, the OLED of each subpixel are also correspondingly in a square or a diamond shape. As shown in FIG. 7B, subpixels R for red color, subpixels G for green color, and subpixels B for blue color may be arranged in a regular manner. The gate lines GL may extend horizontally between the subpixels while data lines DL may extend vertically between the subpixels. Because the shape of the subpixel is a square or a diamond shape, more clearance may be available between data lines. Further, the square or the diamond shape enables more nodes of the subpixels to be shared, facilitates efficient routing of metal lines, enables better alignment with optical components such as color filters and micro-lenses which preferably have a square or a hexagon shape.

The arrangement of colors in the array of subpixels in FIG. 7B is merely illustrative, and different color arrangement may be used instead (e.g., red, green, blue and white). Moreover, different patterns of colors may be used instead of the pattern illustrated in FIG. 7B.

FIG. 7C is a diagram illustrating an arrangement of subpixels, according to one embodiment. In FIG. 7C, an arrangement of four subpixels 780A through 780D is illustrated. The subpixels are shaped as a square rotated 45 degrees. Other subpixels are also arranged in the same manner but are omitted in FIG. 7C for the sake of brevity.

Figure 8A:
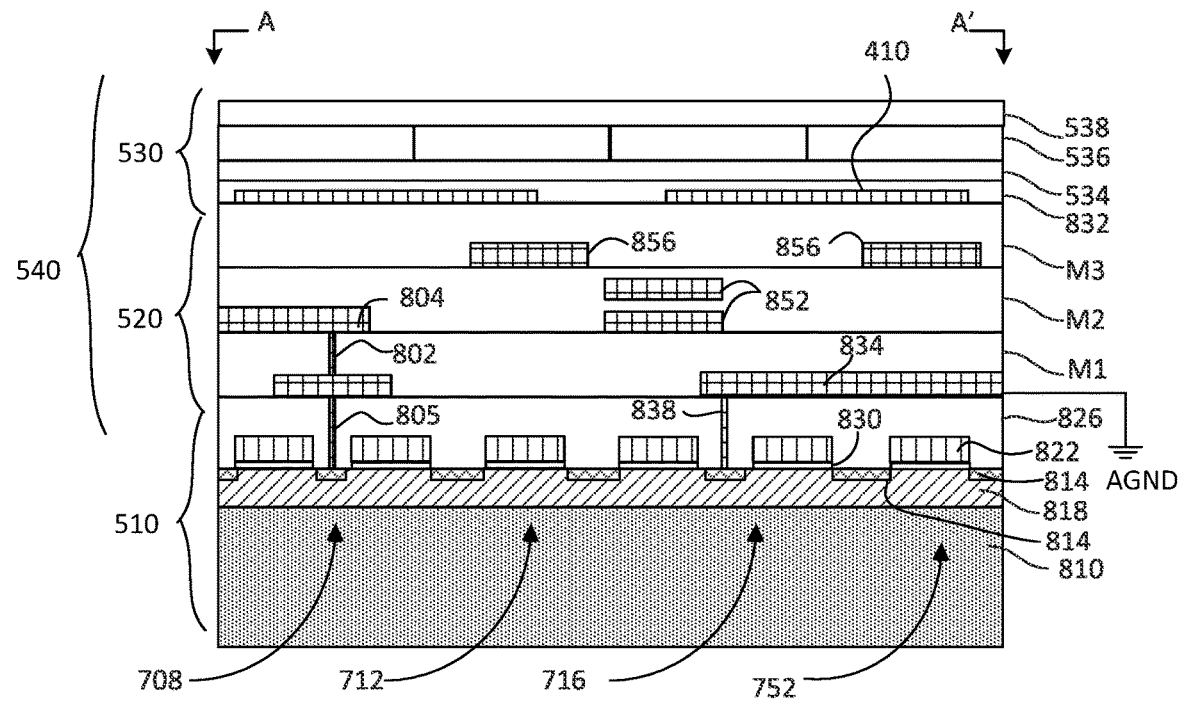
FIG. 8A is a cross-sectional view of a display area taken along line A-A' of FIG. 7A, according to some embodiments.

FIG. 8A is a cross-sectional view of the display area 530 taken along line A-A' of FIG. 7A, according to some embodiments. The display area 530 has an active matrix 832 (such as OLED 400)(see FIGS. 8A through 8D) disposed over a single crystal (e.g., silicon) backplane 520. The backplane 520 may include multiple metal layers (e.g., layers M1 through M3) formed with through vias for electrically connecting circuit components of the DDIC 510 with the active display area 530. In some embodiments, the display area 530 may further include a transparent encapsulation layer 534 disposed over the active matrix 832, a color filter 536, and cover glass 538.

In metal layers M1 through M3, circuit components (e.g., capacitor 852) and conductive lines 856 are formed. The conductive lines 856 may be connected to contacts of transistors provided in the DDIC 510 and/or other circuit components (e.g., capacitor 852) through vias.

The DDIC 510 may include a silicon substrate 810 formed with circuit components, and additional layers on top of these circuit components (e.g., planarization layer 826). The circuit components in the DDIC 510 may include transistors (e.g., transistors 708, 712, 716, 752). A driving transistor 752 may include, for example, an active area 818, source/drain electrodes 814, gate electrode 822, and gate oxide 830.

Through contacts and vias electrodes or other circuit components in the DDIC 510 are connected to conductive lines or other components in the metal layers. For example, a through contact 838 is formed through a planarization layer 826 and the gate oxide 830 to connect a conductive line 834 in the metal layer M1 with a drain electrode of the reset transistors 716. The conductive line 834 is connected to the ground or the lower voltage source (AGND). That is, four reset transistors 716 share the common contact 838 for connection to the ground or the lower voltage source (AGND). Also, a through via 802 is formed through the planarization layer 826 and a contact 805 of the metal layer M1 to a conductive line 804 in order to connect a source electrode of the switch transistor 708 to the high voltage source ELVDD. Other vias may be formed in the planarization layer and/or the metal layers M1 through M3 to connect with other conductive lines but are not shown in FIGS. 8A through 8D for the sake of brevity.

Figure 8B:
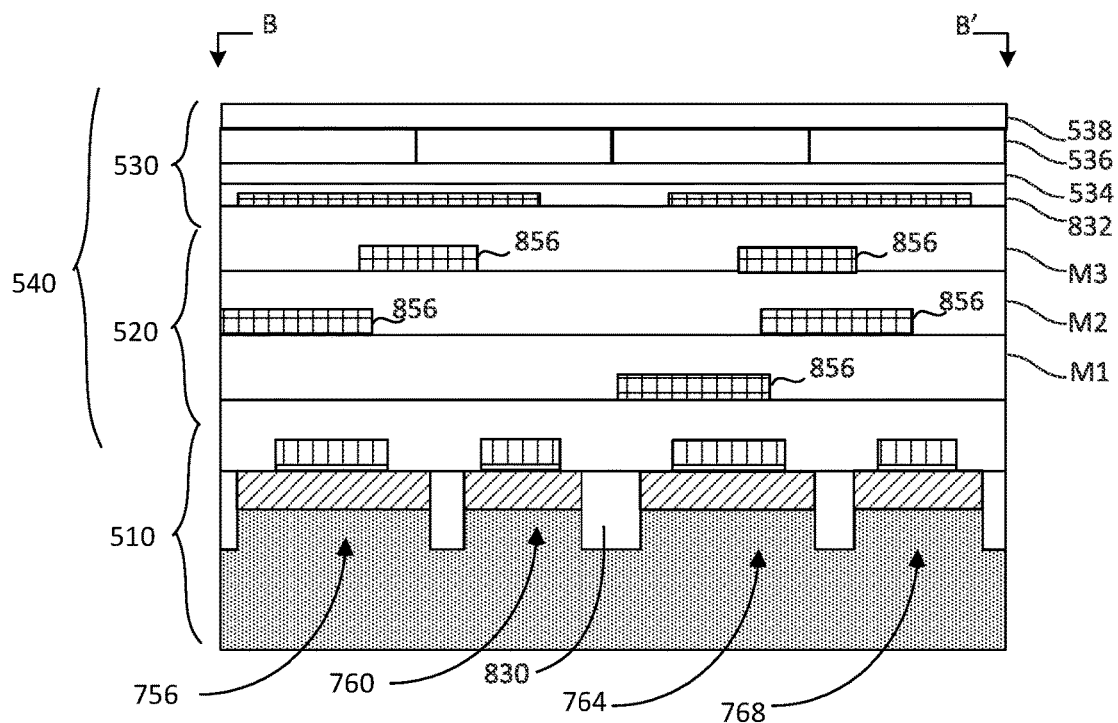
FIG. 8B is a cross-sectional view of a display area taken along line B-B' of FIG. 7A, according to some embodiments.

FIG. 8B is a cross-sectional view of the display area 530 taken along line B-B' of FIG. 7A, according to some embodiments. As shown in FIG. 8B, a driving transistor 756, select transistors 760, a driving transistor 764, and a select transistor 768 are arranged along line B-B'. Shallow trench isolation areas (e.g., 830) are formed between these transistors 756, 760, 764, 768 to prevent interference between the transistors.

Figure 8C:
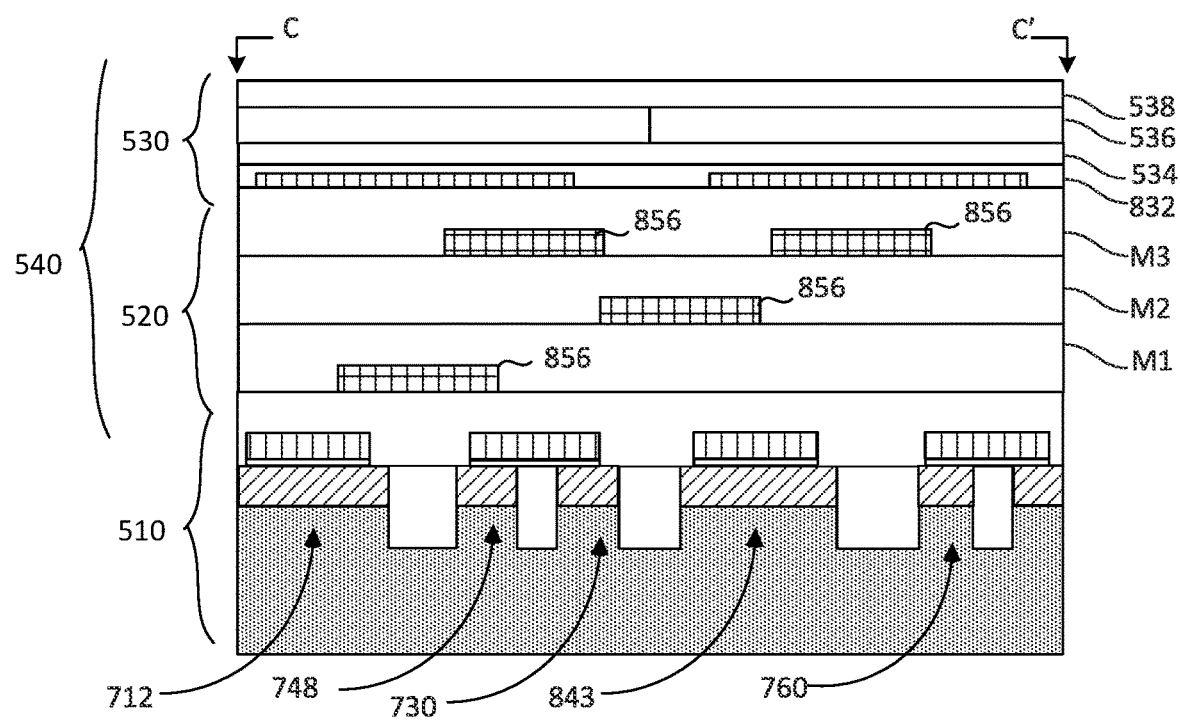
FIG. 8C is a cross-sectional view of a display area taken along line C-C' of FIG. 7A, according to some embodiments.

FIG. 8C is a cross-sectional view of the display area 530 taken along line C-C' of FIG. 7A, according to some embodiments. As shown in FIG. 8C, the driving transistor 712, select transistors 748, 730, a driving transistor 843 and the select transistor 760 are arranged along line C-C'. Shallow trench isolation areas are also formed between these transistors 712, 748, 730, 843 and 760 to prevent interference between the transistors.

Figure 8D:
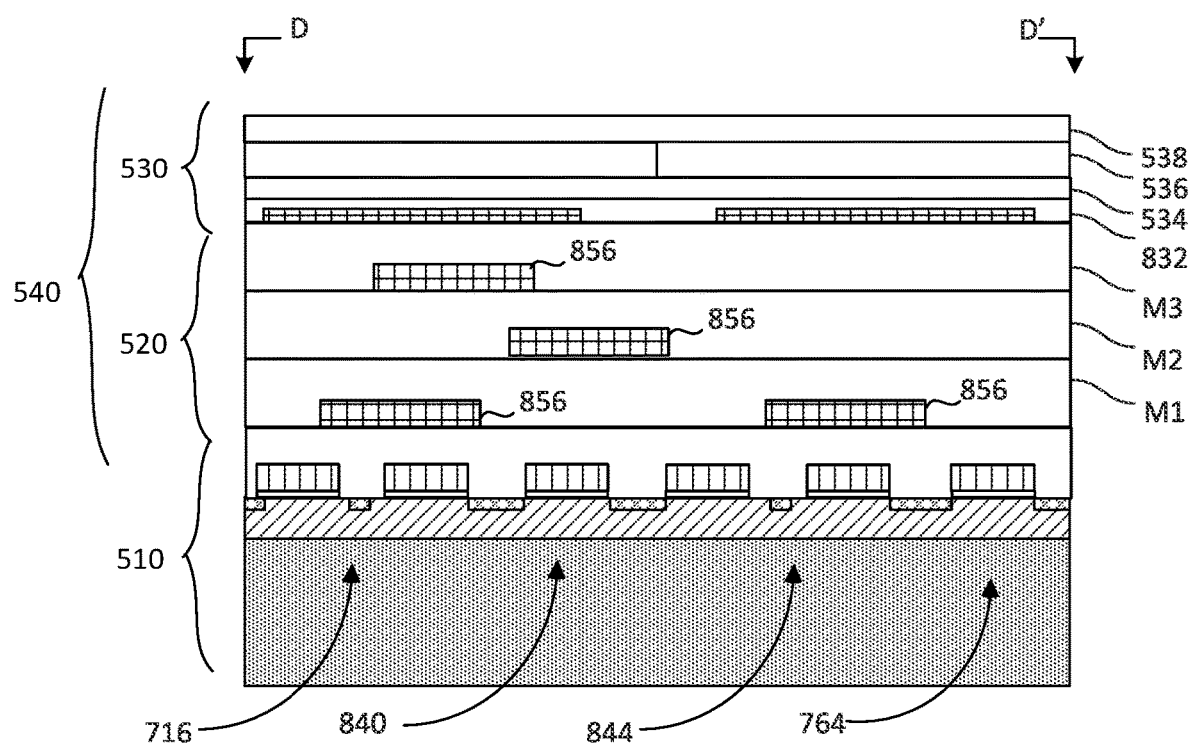
FIG. 8D is a cross-sectional view of a display area taken along line D-D' of FIG. 7A, according to some embodiments.

FIG. 8D is a cross-sectional view of the display area 530 taken along line D-D' of FIG. 7A, according to some embodiments. As shown in FIG. 8D, the reset transistors 716, a driving transistor 840, a switch transistor 844, and the driving transistor 764 are arranged along line C-C'.

The stacking structure of the backplane 520 and the active display area 530 in FIGS. 8A through 8D are merely illustrative. The backplane 520 and/or the active display area 530 may include other components and layers in addition to the transistors shown in these figures. Alternatively, fewer layers may be included in the backplane 520 and/or the active display area 530.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A display device comprising:
  a first subpixel comprising:
    a first organic light emitting diode (OLED) coupled to a low voltage source;
    a first select transistor selectively passing through a first pixel data from a first data line responsive to receiving a gate signal from a gate line;
    a switch transistor configured to selectively connect an active area of the switch transistor to a high voltage source via a contact extending into a center hole penetrating a gate of the switch transistor; and
    a first driving transistor having a drain coupled to the first OLED, a gate coupled to the first select transistor to receive the pixel data, and a source coupled to the switch transistor; and
  a second subpixel adjacent to the first subpixel, the second subpixel sharing the switch transistor with the first subpixel.

2. The display device of claim 1, further comprising a third subpixel and a fourth subpixel that share the switch transistor with the first and second subpixels.

3. The display device of claim 2, wherein the active area and the gate of the switch transistor are shared by the first, second, third and fourth subpixels, and the gate of the switch transistor is square-shaped.

4. The display device of claim 1, wherein the second subpixel comprises a second select transistor that share a gate with the first select transistor, the gate connected to the gate line.

5. The display device of claim 4, wherein a first active area of the first select transistor and a second active area of the second select transistor are separated by a shallow trench isolation.

6. The display device of claim 4, wherein the second subpixel comprises a second driving transistor that extends in a direction perpendicular to the first driving transistor.

7. The display device of claim 2, wherein the first subpixel further comprises a reset transistor configured to selectively connect an anode of the first OLED to the low voltage source.

8. The display device of claim 7, wherein at least a portion of an active area of the reset transistor of the first subpixel is shared with a fifth subpixel but a gate of the reset transistor is not shared with the fifth subpixel.

9. The display device of claim 8, wherein a drain electrode of the reset transistor is connected to the low voltage source through a via.

10. The display device of claim 8, wherein the fifth subpixel is coupled to another gate line distinct from the gate line connected to the first select transistor of the first subpixel.

11. A display device comprising:
  a first subpixel of a first shape and comprising a switch transistor configured to selectively connect a driving transistor of the first subpixel to a high voltage source;
  a second subpixel adjacent to the first subpixel and has a second shape that is a mirrored version of the first shape, wherein the switch transistor is further configured to selectively connect a driving transistor of the second subpixel to the high voltage source;
  a third subpixel adjacent to the first subpixel and having a third shape, wherein the switch transistor is further configured to selectively connect a driving transistor of the third subpixel to the high voltage source; and
  a fourth subpixel adjacent to the first subpixel and having a fourth shape that is a mirrored version of the third shape, the fourth subpixel sharing the switch transistor with the first, second, and third subpixels, wherein the switch transistor is further configured to selectively connect a driving transistor of the fourth subpixel to the high voltage source,
  wherein the switch transistor shared by the first, second, third, and fourth subpixels is located at a common center area of the first, second, third, and fourth subpixels,
  wherein the switch transistor comprises an active area and a squared shaped gate that are shared by the first, second, third, and fourth subpixels, and
  wherein the driving transistors of the first, second, third, and fourth subpixels are positioned at four respective sides of the squared shaped gate.

12. The display device of claim 11, wherein the first subpixel includes a first select transistor, the second subpixel includes a second select transistor, and the first select transistor and the second select transistor share a common gate electrode.

13. The display device of claim 1, wherein the first subpixel includes a first select transistor having a first active area, and the second subpixel includes a second select transistor having a second active area separated from the first active area by a shallow trench isolation.

14. The display device of claim 11, further comprising a fifth subpixel adjacent to the first subpixel, the first subpixel further comprising a reset transistor configured to selectively connect an anode of an OLED of the first subpixel to a low voltage source, and the fifth subpixel includes another reset transistor configured to selectively connect an anode of an OLED of the fifth subpixel to the low voltage source, wherein at least a portion of an active area of the reset transistor of the first subpixel is shared with the fifth subpixel but a gate of the reset transistor is not shared with the fifth subpixel.

15. The display device of claim 14, wherein a drain electrode of the reset transistor is connected to the low voltage source through a via.

16. The display device of claim 14, wherein the first subpixel and the fifth subpixel are coupled to different gate lines.

17. The display device of claim 11, wherein the first, second, third, and fourth subpixels include subpixels of at least two pixels.

18. The display device of claim 11, wherein the first, second, third, and fourth subpixels are subpixels of a same pixel.

* * * * *